United States Patent
Yu et al.

(10) Patent No.: US 9,548,274 B1
(45) Date of Patent: Jan. 17, 2017

(54) RETICLE FOR NON-RECTANGULAR DIE

(71) Applicant: TAIWAN SEMICONDUCTOR MANUFACTURING COMPANY LTD., Hsinchu (TW)

(72) Inventors: Chen-Hua Yu, Hsinchu (TW); Ming-Fa Chen, Taichung (TW); Sung-Feng Yeh, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/947,787

(22) Filed: Nov. 20, 2015

(51) Int. Cl.
| H01L 23/544 | (2006.01) |
| H01L 25/00 | (2006.01) |
| H01L 21/78 | (2006.01) |
| H01L 23/538 | (2006.01) |
| H01L 21/268 | (2006.01) |
| H01L 21/3065 | (2006.01) |
| H01L 27/088 | (2006.01) |
| H01L 27/092 | (2006.01) |

(52) U.S. Cl.
CPC .......... *H01L 23/544* (2013.01); *H01L 21/268* (2013.01); *H01L 21/3065* (2013.01); *H01L 21/78* (2013.01); *H01L 23/5384* (2013.01); *H01L 25/50* (2013.01); *H01L 27/0886* (2013.01); *H01L 27/092* (2013.01); *H01L 2223/54453* (2013.01)

(58) Field of Classification Search
CPC ................................................ H04L 27/14632
USPC .................................................. 257/620, 627
See application file for complete search history.

(56) References Cited

U.S. PATENT DOCUMENTS

2012/0264276 A1* 10/2012 Reed .................... G03F 7/70425
438/462
2013/0108948 A1* 5/2013 Hu ............................ G03F 1/38
430/5

* cited by examiner

*Primary Examiner* — Dung Le
(74) *Attorney, Agent, or Firm* — WPAT, P.C., Intellectual Property Attorneys; Anthony King

(57) ABSTRACT

The present disclosure provides a semiconductor structure. The semiconductor structure includes a non-rectangular die area, a dicing ring and a reticle area surrounding the non-rectangular die. The dicing ring is within the reticle area and surrounds the non-rectangular die area. The number of edges of the reticle area is not equal to 4.

20 Claims, 5 Drawing Sheets

RETICLE FOR NON-RECTANGULAR DIE

BACKGROUND

In the manufacture of semiconductor chip devices, photolithographic processes are often used to pattern various layers on a wafer in order to produce circuit features positioned as specified in a circuit layout. In such processes, a layer of resist (also referred to as "photoresist") is deposited on the layer being patterned, and the resist is then exposed using an exposure tool and a template. These templates are known in the art as reticles or masks. For purposes of the present application, the term reticle includes both reticles and masks, and the two terms are interchangeable herein. During the exposure process, the reticle is imaged onto the resist by directing a form of radiant energy such as ultraviolet light through the reticle to selectively expose the resist in a desired pattern. The pattern which is produced in the resist is referred to herein as a "feature layout".

The costs for producing reticles have increased due to miniaturization of semiconductor integrated circuit device over these recent years. Therefore, it is desirable to develop a reticle having a maximum capacity usage to accommodate a die, especially a non-rectangular die.

BRIEF DESCRIPTION OF THE DRAWINGS

Aspects of the present disclosure are best understood from the following detailed description when read with the accompanying drawings. It is noted that, in accordance with the practices in the industry, various features are not drawn to scale. In fact, the dimensions of the various features may be arbitrarily increased or reduced for clarity of discussion.

DETAILED DESCRIPTION

Figure 1A:
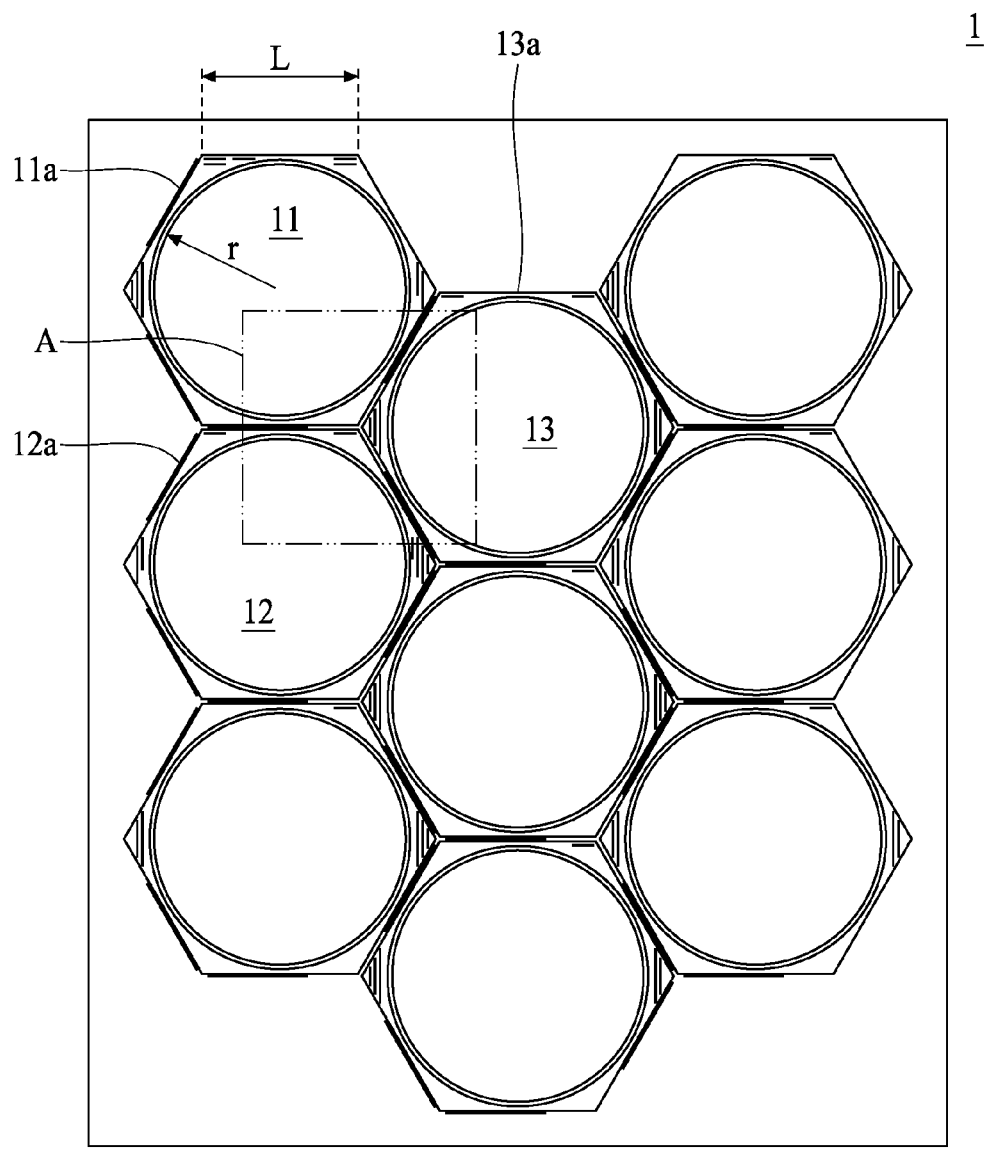
FIG. 1A is a top view of a mask, in accordance with some embodiments.

The following disclosure provides many different embodiments, or examples, for implementing different features of the present invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship with another element(s) or feature(s) as illustrated in the drawings. The spatially relative terms are intended to encompass different orientations of the device in use or operation in addition to the orientation depicted in the drawings. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the present invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. Each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A illustrates a top view of a mask 1 in accordance with one embodiment of the present disclosure. The mask 1 includes a plurality of reticles 11a, 12a, 13a, each has a design pattern (or layout) 11, 12, 13 of an integrated circuit (IC) thereon.

As shown in FIG. 1A, the design patterns 11, 12, 13 are non-rectangular. In particularly, the design patterns 11, 12, 13 are circular with a radius of r. In some embodiments of the present disclosure, the design patterns 11, 12, 13 may comprise planar complementary metal-oxide-semiconductors (CMOS), FinFETs or the combination thereof. The reticles 11a, 11b, 11c with the design patterns 11, 12, 13 printed thereon are hexagonal. In an embodiment, the shape of each reticle 11a, 12a, 13a is a regular hexagon. Alternatively, the shape of each reticle 11a, 12a, 13a may be an irregular hexagon. In some embodiment, two adjacent reticles are separated from each other at a distance. Alternatively two adjacent reticles substantially contact to each other. The length L of the edge of each reticle 11a, 12a, 13a is equal to or greater than $2\sqrt{3}r/3$ (where r is the radius of each design pattern). A ratio of the area of each reticle 11a, 11b, 11c to the area of the corresponding design pattern 11, 12, 13 is equal to or greater than $2\sqrt{3}/\pi$.

In some embodiments, reticles on which circular design patterns are printed may be rectangular. The length L of the edge of the reticles is equal to or greater than 2r (where r is the radius of each design pattern). A ratio of the area of the reticles to the area of the corresponding design patterns is equal to or greater than $4/\pi$. In the case of a circular pattern design, the area of the hexagonal reticle 11a, 12a, 13a shown in FIG. 1A is about 13.3% smaller than that of the rectangular reticle. Therefore, in comparison with a rectangular reticle, a hexagonal reticle occupies smaller area. In an embodiment, the length of the mask 1 is about 33 millimeter (mm) and the width of the mask 1 is about 26 mm. By using the hexagonal reticle shown in FIG. 1A, a mask 1 can accommodate more pattern designs, which would in turn reduce the manufacturing cost.

In some embodiments, reticles on which circular design patterns are printed may be triangular. The length L of the edge of the reticles is equal to or greater than $2\sqrt{3}r$ (where r is the radius of each design pattern). A ratio of the area of the reticles to the area of the corresponding design patterns is equal to or greater than $3\sqrt{3}/\pi$. In the case of a circular pattern design, the area of the hexagonal reticle 11a, 12a, 13a shown in FIG. 1A is about 33.3% smaller than that of the triangular reticle. Therefore, in comparison with a triangular reticle, a hexagonal reticle occupies smaller area. By using the hexagonal reticle shown in FIG. 1A, a mask 1 can accommodate more pattern designs, which would in turn reduce the manufacturing cost.

In some embodiments, reticles on which circular design patterns are printed may be other polygonal with n edges, wherein n is not equal to 3, 4 or 6. However, only triangular reticles, rectangular reticles or hexagonal reticles have closest arrangement. Other polygonal reticles would have many wasted spaces between two adjacent reticles due to their nature. Therefore, by using the hexagonal reticle shown in FIG. 1A, a mask can accommodate more pattern designs, which would in turn reduce the manufacturing cost.

In some embodiments, the IC is manufactured by providing a design pattern of IC devices. In an example, the IC devices include MOSFET devices. The design pattern is a post-optical proximity correction (OPC) design pattern. However, in other embodiments, the design pattern may be any virtual or physical design pattern.

A mask based on the design pattern is created by using a mask process. The mask process is any mask process known in the art. Then an IC layout contour is generated based on the mask created previously. The IC layout contour is extracted via a mask extraction process implemented by a mask contour apparatus. For example, the mask contour apparatus may include a scanning electron microscope (SEM) adapted to capture SEM images of a mask. In other embodiments, various wafer scanning systems other than an SEM may be used. For example, an optical microscope system, a scanning probe microscope system, a laser microscope system, a transmission electron microscope system, a focus ion beam microscope system, or other suitable optical imaging systems may be used instead of an SEM to create the IC layout contour. Furthermore, the mask extraction process may include using data from the SEM images to create a mask SEM contour. As an example, an edge detector may be used to generate the IC layout contour. In other embodiments, the IC layout contour may be any physical IC layout contour that provides a representation of a mask contour.

Then, a wafer (or a physical wafer pattern) is produced by a wafer process using the mask. The wafer process includes a lithography process (or physical lithography process to be differentiated from a virtual lithography process). In one embodiment, the wafer process includes a lithography process and an etching process to form a patterned material layer on the wafer. The physical wafer pattern may be produced using any suitable wafer process known in the art.

A deconvolution pattern may be extracted from the IC mask contour by performing a deconvolution mask process. The deconvolution mask process includes deriving the deconvolution pattern using data that represents the IC mask contour produced previously. For example, the deconvolution mask algorithm reverses the SEM contours of the mask SEM contour to obtain the deconvolution mask pattern. The deconvolution mask pattern should include substantially the same polygons present in the original design pattern. In another embodiment, a deconvolution theorem to a mask SEM contour to obtain a deconvolution pattern may not be used as taught herein. Instead, measured or simulated mask SEM contours can be used directly and these SEM contours can be compared with the original designed IC layout to check hot spot during the mask making process.

In one embodiment, mask SEM contours are obtained by convolving the E-beam writing process with the designed IC layout. The deconvolution algorithm separate the effects of E-beam writing process from the mask SEM contour and obtain the deconvolution pattern which should be kept the same geometry if there are no changes during the mask making process and the original designed layout. Failure mode analysis can be applied when the geometry of deconvolution pattern exceed the mask making tolerance. The deconvolution algorithm uses the original IC layout as the initial guess and change the geometry of the mask pattern during numerical iterations. The final deconvoluton mask pattern will be obtained once the optimization is reached between the simulation and measured mask SEM contours.

Then, a virtual wafer is obtained by performing a virtual lithography process simulation. The lithography process simulator imports the deconvolution mask pattern and generate the simulated resist image on the wafer layout via using the production lithography model. The production lithography model is usually a kind of lumped process model that includes the process effect both for mask making and resist development. The resist image of the virtual wafer pattern can be obtained by convolving the lithography model with polygons on the deconvolution mask pattern.

In some embodiments, a failure mode analysis is performed using the physical wafer pattern and the virtual wafer pattern. The failure mode analysis includes determining whether a defect exists in both the physical and virtual wafer patterns. A defect includes variations in CD and/or spacing represented in both the physical and virtual wafer patterns. If the defect is present in both the physical and the virtual wafer patterns, then the mask process is identified as the root cause of the defect. However, if the defect is not present in both the physical and the virtual wafer patterns, then this confirms that the mask process is not the root cause of the defect.

A pattern-matching analyzer and/or a lithography process analyzer may be used as part of the failure mode analysis to compare the physical and virtual wafer patterns. For example, the pattern matching analyzer may compare the critical dimensions (CD) and/or spacing of features present in the physical and virtual wafer patterns to determine whether a defect is present in both the virtual and the physical wafer patterns. The lithography process analyzer simulates the virtual wafer patterns of the deconvoluted design pattern from real mask contour patterns. Since it uses the real production model to do the simulation. If the defect is present, it indicates this mask contour shape can induce it. Therefore, the pattern-matching analyzer aims to be able to identify those patterns that are out of the user-defined tolerance of wafer CD and/or spacing criteria. This means that this pattern matching is not a pattern shape matching, but just one kind of specific pattern characteristic. In other words, this kind of pattern characteristics identifying approach should be achieved more efficiently.

In some embodiments, the pattern matching analyzer may calculate a quality index based upon the CD and/or spacing of features present in the original design pattern and the deconvolution pattern. The quality index may then be used to evaluate the quality of the mask process. Since the deconvolution pattern and the original IC design pattern should have similar pattern geometries, it is easier for a pattern-matching analyzer to identify defects that are common among the deconvolution pattern and the original design pattern.

If a kind of pattern is defined as a defect, it indicates that a portion of this pattern's CD or/and spacing is out of the specifications. Therefore, the quality indexes are usually defined for those locations. For example, it can be defined as the CD and/or spacing deviation percentage.

In yet another embodiment of the present disclosure, the design pattern may be provided as an input to a virtual mask process simulation in order to generate a golden mask contour sample. This type of golden mask shape may assist to define the criteria or limitation of a real mask shape. If there is a golden mask sample, it can directly compare the mask contour pattern with this golden mask sample and, based on a predefined criteria of a mask shape, classify whether this real mask shape would induce defects or not. As such, this kind of mask shape comparison approach should be an efficient approach. In other words, because this only needs the pattern comparison or pattern matching, it may be the more efficient approach when compared to a more complicated lithography process simulation.

According to another embodiment of the present disclosure, the mask extraction process may be replaced with another virtual mask process simulation to generate a second virtual mask contour rather than a physical mask contour. It may be desirable to do this so that the second virtual mask contour may be compared to a virtual mask contour to determine the quality of a virtual mask process simulation. Furthermore, in another embodiment, the physical lithography process \may be replaced with another virtual lithography process simulation to simulate another virtual wafer pattern. This may be helpful in comparing virtual wafer patterns to determine the quality of virtual lithography process simulations.

Figure 1B:
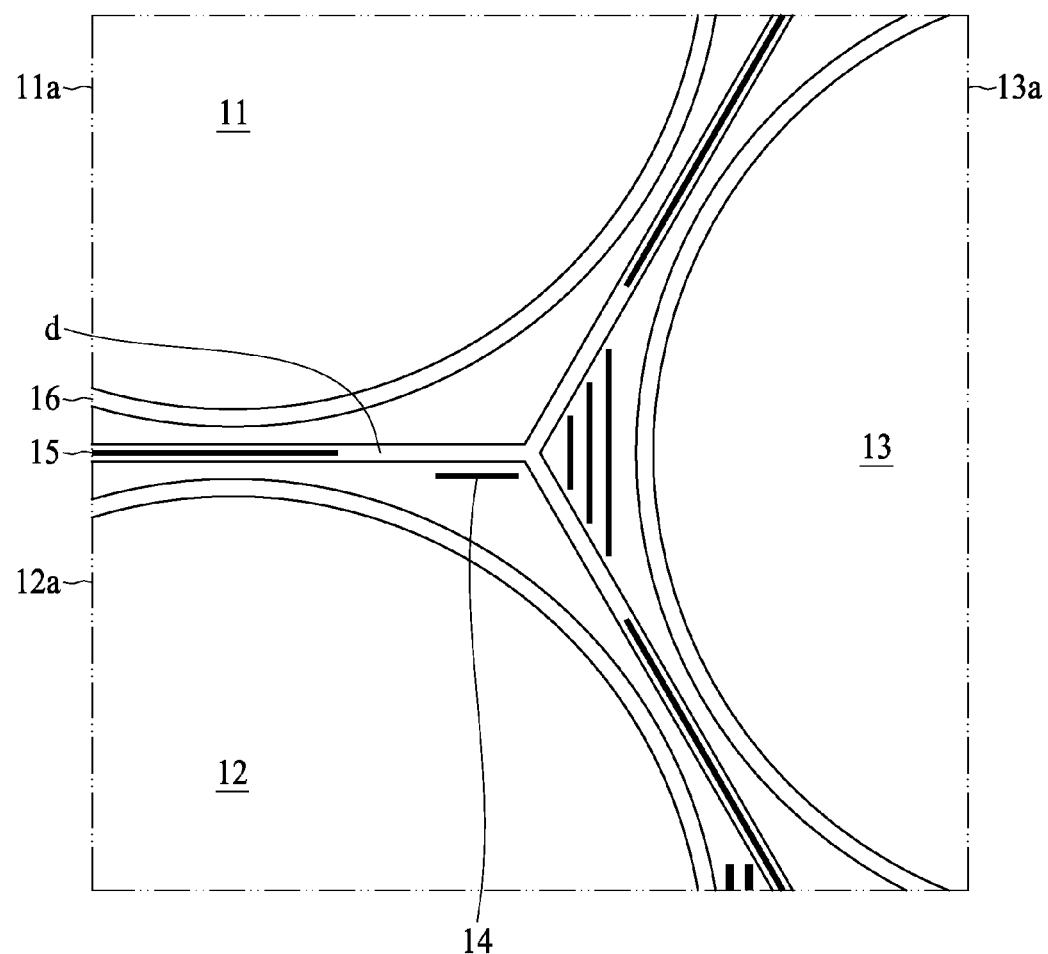
FIG. 1B is an enlarged view of a part of the mask shown in FIG. 1A, in accordance with some embodiments.

FIG. 1B illustrates an enlarged view of the mask 1 of FIG. 1A, taken along the dotted rectangle A. As shown in FIG. 1B, two adjacent reticles are separated from each other in a distance d, and a mark 15 about the process control monitor (PCM) is printed in a space between two separated reticles. In some embodiments, the distance d is less than 1 mm. A mark 14 about the information of the design pattern is printed within the reticle. In an embodiment, the mark 14 can be printed in a space between two separated reticles. In some embodiments, two adjacent reticles may contact to each other, and thus there is no space between two adjacent reticles. Both of the marks 14 and 15 can be printed within the reticle. In some embodiments, the size of the mark 14 is about 842 μm×80 μm. In some embodiments, the size of the mark 15 is about 2860 μm×60 μm. In some embodiments, the marks 14 and 15 are alignment marks.

A dicing ring 16 surrounds each design patterns 11, 12, 13. The dicing ring 16 is a path for singulation process. The singulation process can be performed by, for example, laser, plasma or other cutting tools. In an embodiment, the width of the dicing ring is about 20 μm. As shown in FIG. 1B, the dicing ring 16 is spaced apart from the edge of the reticle in a distance. In an embodiment, the distance between the dicing ring 16 and the edge of the reticle is in a range from about 10 μm to about 500 μm.

Figure 2A:
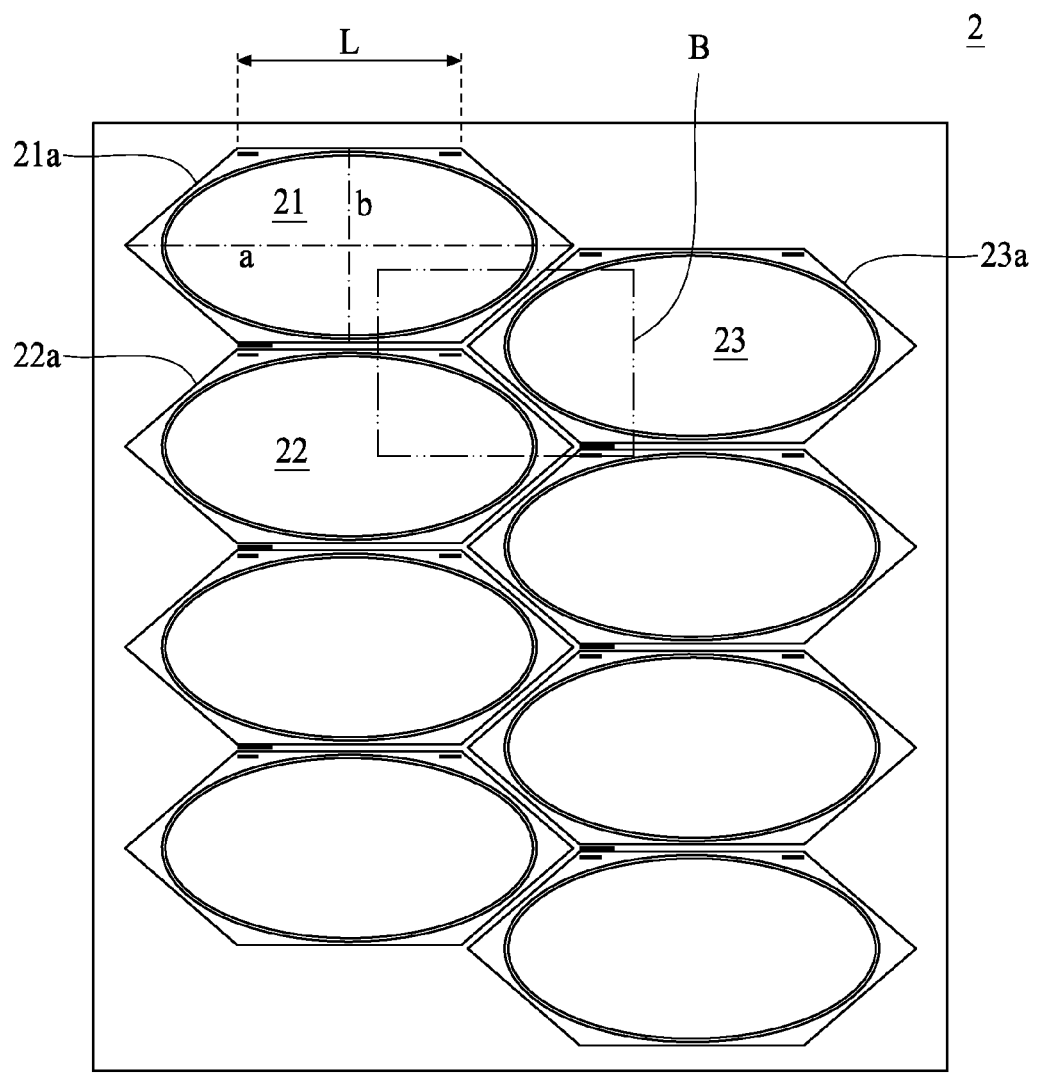
FIG. 2A is a top view of a mask, in accordance with some embodiments.

FIG. 2A illustrates a top view of a mask 2 in accordance with one embodiment of the present disclosure. The mask 2 includes a plurality of reticles 21a, 22a, 23a, each has a design pattern (or layout) 21, 22, 23 of an integrated circuit (IC) thereon.

As shown in FIG. 2A, the design patterns 21, 22, 23 are non-rectangular. In particularly, the design patterns 21, 22, 23 are elliptical with a major axis a and a minor axis b. In some embodiments of the present disclosure, the design patterns 21, 22, 23 may comprise planar complementary metal-oxide-semiconductors (CMOS), FinFETs or the combination thereof. The reticles 21a, 22a, 23a with the design patterns 21, 22, 23 printed thereon are hexagonal. In an embodiment, the shape of each reticle 21a, 22a, 23a is a regular hexagon. In some embodiment, two adjacent reticles are separated from each other at a distance. Alternatively two adjacent reticles substantially contact to each other. A ratio of the area of each reticle 21a, 22a, 23a to the area of the corresponding design pattern 21, 22, 23 is equal to or greater than $L/a\pi+2/\pi$.

In some embodiments, reticles on which circular design patterns are printed may be rectangular. A ratio of the area of the rectangular reticles to the area of the corresponding elliptical design patterns is equal to or greater than $4/\pi$. In the case of an elliptical pattern design, the area of the hexagonal reticle 21a, 22a, 23a shown in FIG. 2A is about $L/a\pi+2/\pi$ smaller than that of the rectangular reticle. Therefore, in comparison with a rectangular reticle, a hexagonal reticle occupies smaller area. In an embodiment, the length of the mask 2 is about 33 millimeter (mm) and the width of the mask 2 is about 26 mm. By using the hexagonal reticle shown in FIG. 2A, a mask 2 can accommodate more pattern designs, which would in turn reduce the manufacturing cost.

In some embodiments, reticles on which circular design patterns are printed may be other polygonal with n edges, wherein n is not equal to 4 or 6. However, only triangular reticles, rectangular reticles or hexagonal reticles have closest arrangement. Other polygonal reticles would have many wasted spaces between two adjacent reticles due to their nature. Therefore, by using the hexagonal reticle shown in FIG. 2A, a mask 2 can accommodate more pattern designs, which would in turn reduce the manufacturing cost.

In some embodiments, the IC is manufactured by providing a design pattern of IC devices. In an example, the IC devices include MOSFET devices. The design pattern is a post-optical proximity correction (OPC) design pattern. However, in other embodiments, the design pattern may be any virtual or physical design pattern.

A mask based on the design pattern is created by using a mask process. The mask process is any mask process known in the art. Then an IC layout contour is generated based on the mask created previously. The IC layout contour is extracted via a mask extraction process implemented by a mask contour apparatus. For example, the mask contour apparatus may include a scanning electron microscope (SEM) adapted to capture SEM images of a mask. In other embodiments, various wafer scanning systems other than an SEM may be used. For example, an optical microscope system, a scanning probe microscope system, a laser microscope system, a transmission electron microscope system, a focus ion beam microscope system, or other suitable optical imaging systems may be used instead of an SEM to create the IC layout contour. Furthermore, the mask extraction process 207 may include using data from the SEM images to create a mask SEM contour. As an example, an edge detector may be used to generate the IC layout contour. In other embodiments, the IC layout contour may be any physical IC layout contour that provides a representation of a mask contour.

Then, a wafer (or a physical wafer pattern) is produced by a wafer process using the mask. The wafer process includes a lithography process (or physical lithography process to be differentiated from a virtual lithography process). In one embodiment, the wafer process includes a lithography process and an etching process to form a patterned material layer on the wafer. The physical wafer pattern may be produced using any suitable wafer process known in the art.

A deconvolution pattern may be extracted from the IC mask contour by performing a deconvolution mask process. The deconvolution mask process includes deriving the deconvolution pattern using data that represents the IC mask contour produced previously. For example, the deconvolution mask algorithm reverses the SEM contours of the mask SEM contour to obtain the deconvolution mask pattern. The deconvolution mask pattern should include substantially the same polygons present in the original design pattern. In another embodiment, a deconvolution theorem to a mask SEM contour to obtain a deconvolution pattern may not be used as taught herein. Instead, measured or simulated mask SEM contours can be used directly and these SEM contours can be compared with the original designed IC layout to check hot spot during the mask making process.

In one embodiment, mask SEM contours are obtained by convolving the E-beam writing process with the designed IC layout. The deconvolution algorithm separate the effects of E-beam writing process from the mask SEM contour and obtain the deconvolution pattern which should be kept the same geometry if there are no changes during the mask making process and the original designed layout. Failure mode analysis can be applied when the geometry of deconvolution pattern exceed the mask making tolerance. The deconvolution algorithm uses the original IC layout as the initial guess and change the geometry of the mask pattern during numerical iterations. The final deconvoluton mask pattern will be obtained once the optimization is reached between the simulation and measured mask SEM contours.

Then, a virtual wafer is obtained by performing a virtual lithography process simulation. The lithography process simulator imports the deconvolution mask pattern and generate the simulated resist image on the wafer layout via using the production lithography model. The production lithography model is usually a kind of lumped process model that includes the process effect both for mask making and resist development. The resist image of the virtual wafer pattern can be obtained by convolving the lithography model with polygons on the deconvolution mask pattern.

In some embodiments, a failure mode analysis is performed using the physical wafer pattern and the virtual wafer pattern. The failure mode analysis includes determining whether a defect exists in both the physical and virtual wafer patterns. A defect includes variations in CD and/or spacing represented in both the physical and virtual wafer patterns. If the defect is present in both the physical and the virtual wafer patterns, then the mask process is identified as the root cause of the defect. However, if the defect is not present in both the physical and the virtual wafer patterns, then this confirms that the mask process is not the root cause of the defect.

A pattern-matching analyzer and/or a lithography process analyzer may be used as part of the failure mode analysis to compare the physical and virtual wafer patterns. For example, the pattern matching analyzer may compare the critical dimensions (CD) and/or spacing of features present in the physical and virtual wafer patterns to determine whether a defect is present in both the virtual and the physical wafer patterns. The lithography process analyzer simulates the virtual wafer patterns of the deconvoluted design pattern from real mask contour patterns. Since it uses the real production model to do the simulation. If the defect is present, it indicates this mask contour shape can induce it. Therefore, the pattern-matching analyzer aims to be able to identify those patterns that are out of the user-defined tolerance of wafer CD and/or spacing criteria. This means that this pattern matching is not a pattern shape matching, but just one kind of specific pattern characteristic. In other words, this kind of pattern characteristics identifying approach should be achieved more efficiently.

In some embodiments, the pattern matching analyzer may calculate a quality index based upon the CD and/or spacing of features present in the original design pattern and the deconvolution pattern. The quality index may then be used to evaluate the quality of the mask process. Since the deconvolution pattern and the original IC design pattern should have similar pattern geometries, it is easier for a pattern-matching analyzer to identify defects that are common among the deconvolution pattern and the original design pattern.

If a kind of pattern is defined as a defect, it indicates that a portion of this pattern's CD or/and spacing is out of the specifications. Therefore, the quality indexes are usually defined for those locations. For example, it can be defined as the CD and/or spacing deviation percentage.

In yet another embodiment of the present disclosure, the design pattern may be provided as an input to a virtual mask process simulation in order to generate a golden mask contour sample. This type of golden mask shape may assist to define the criteria or limitation of a real mask shape. If there is a golden mask sample, it can directly compare the mask contour pattern with this golden mask sample and, based on a predefined criteria of a mask shape, classify whether this real mask shape would induce defects or not. As such, this kind of mask shape comparison approach should be an efficient approach. In other words, because this only needs the pattern comparison or pattern matching, it may be the more efficient approach when compared to a more complicated lithography process simulation.

According to another embodiment of the present disclosure, the mask extraction process may be replaced with another virtual mask process simulation to generate a second virtual mask contour rather than a physical mask contour. It may be desirable to do this so that the second virtual mask contour may be compared to a virtual mask contour to determine the quality of a virtual mask process simulation. Furthermore, in another embodiment, the physical lithography process \may be replaced with another virtual lithography process simulation to simulate another virtual wafer pattern. This may be helpful in comparing virtual wafer patterns to determine the quality of virtual lithography process simulations.

Figure 2B:
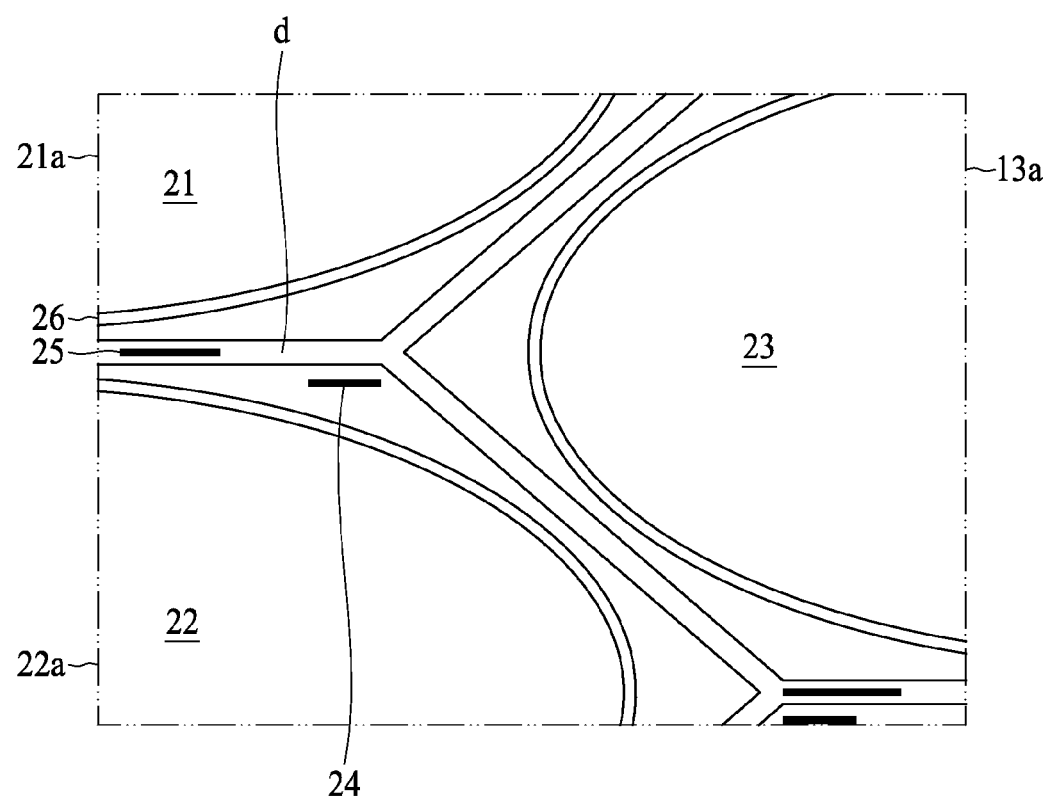
FIG. 2B is an enlarged view of a part of the mask shown in FIG. 1A, in accordance with some embodiments.

FIG. 2B illustrates an enlarged view of the mask 2 of FIG. 2A, taken along the dotted rectangle B. As shown in FIG. 2B, two adjacent reticles are separated from each other in a distance d, and a mark 25 about the process control monitor (PCM) is printed in a space between two separated reticles. In some embodiments, the distance d is less than 1 mm. A mark 24 about the information of the design pattern is printed within the reticle. In an embodiment, the mark 24 can be printed in a space between two separated reticles. In some embodiments, two adjacent reticles may contact to each other, and thus there is no space between two adjacent reticles. Both of the marks 24 and 25 can be printed within the reticle. In some embodiments, the size of the mark 24 is about 842 µm×80 µm. In some embodiments, the size of the mark 25 is about 2860 µm×60 µm.

A dicing ring 26 surrounds each design patterns 21, 22, 23. The dicing ring 26 is a path for singulation process. The singulation process can be performed by, for example, laser, plasma or other cutting tools. In an embodiment, the width of the dicing ring is about 20 µm. As shown in FIG. 2B, the dicing ring 26 is spaced apart from the edge of the reticle in a distance. In an embodiment, the distance between the dicing ring 26 and the edge of the reticle is in a range about 10 µm to about 500 µm.

Figure 3:
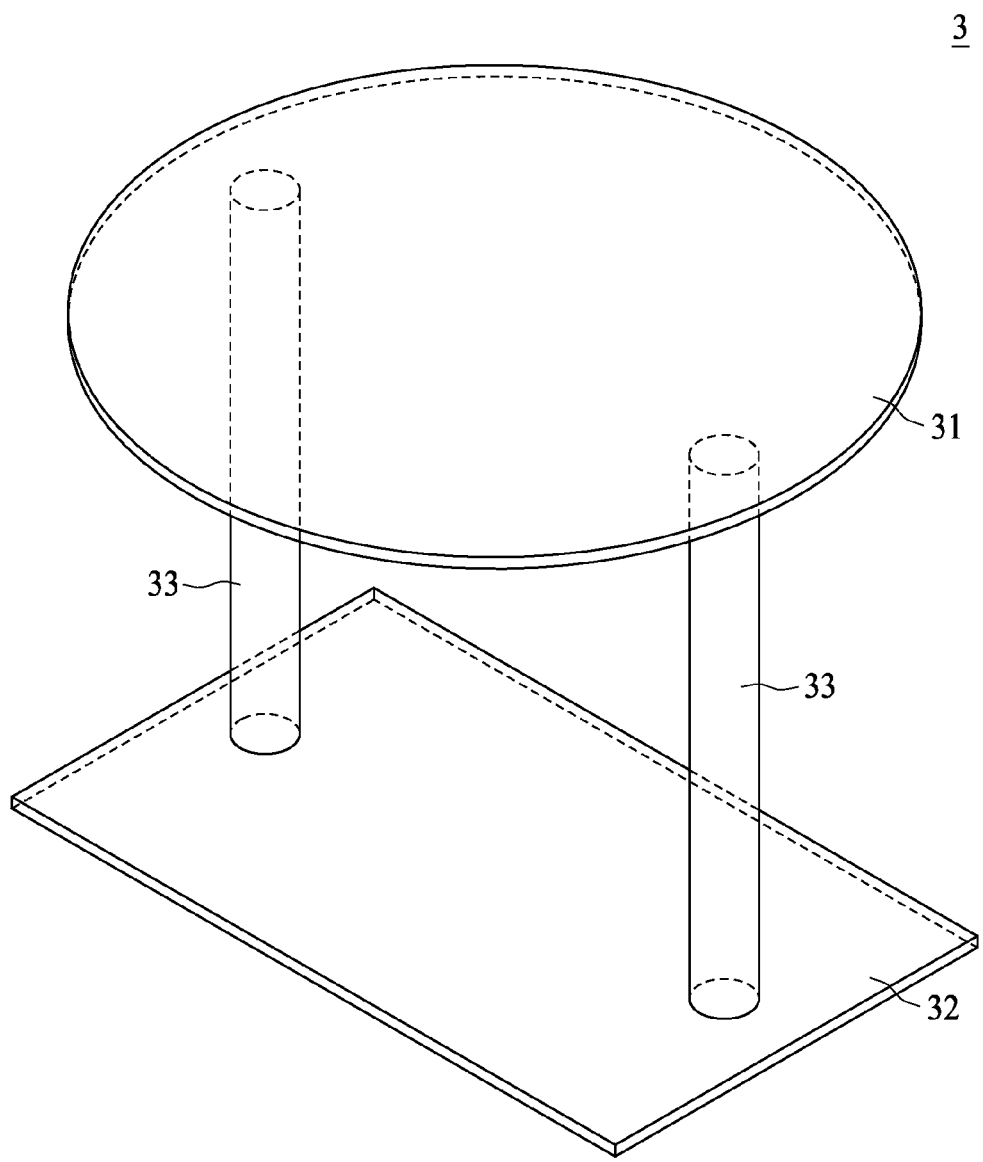
FIG. 3 illustrates a semiconductor device, in accordance with some embodiments.

FIG. 3 illustrates a semiconductor device 3 in accordance with some embodiments of the present disclosure. In some embodiments, the semiconductor device 3 is a three-dimensional integrated circuit (3D IC). The semiconductor device 3 comprises a first chip 31, a second chip 32 and through substrate vias (TSVs) 33.

The first chip 31 is a non-rectangular chip. In some embodiments, the first chip 31 may be a circular chip or an elliptical chip. The second chip 32 is a rectangular chip. The first chip 31 is stacked over the second chip 32 and are electrically interconnected using TSVs 33.

In view of the above, a preferred aspect of the present disclosure is to provide a reticle having a maximum capacity usage. By using hexagonal reticles, in accordance with some embodiments of the present disclosure, a mask can accommodate more pattern designs, which would in turn reduce the manufacturing cost. In addition, it is more flexible for circuit design by interconnecting two or more chips with different shapes to form a 3D IC.

Some embodiments of the present disclosure provide a semiconductor structure, comprising a non-rectangular die area, a dicing ring, and a reticle area surrounding the non-rectangular die. The dicing ring is within the reticle area and surrounds the non-rectangular die area. The number of edges of the reticle area is not equal to 4.

Some embodiments of the present disclosure provide a semiconductor wafer, comprising: a plurality of non-rectangular die areas and a plurality of reticle areas. Each reticle area surrounds the corresponding non-rectangular die area. The reticle areas are non-rectangular.

In some embodiments of the present disclosure, a method of forming a non-rectangular die is provided. The method includes: measuring an area of the non-rectangular die and determining a number of edges of the polygonal reticle area, so that a ratio of the area of the polygonal reticle area to that of the non-rectangular die is less than 4/π.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. A semiconductor structure, comprising:
   a non-rectangular die area;
   a reticle area surrounding the non-rectangular die area; and
   a dicing ring within the reticle area and surrounding the non-rectangular die area, wherein
   the number of edges of the reticle area is not equal to 4.

2. The semiconductor structure of claim 1, wherein the shape of the non-rectangular die area is circular.

3. The semiconductor structure of claim 2, wherein the number of edges of the reticle area is 6, and wherein each angle of the reticle area is 120 degree.

4. The semiconductor structure of 1, wherein the shape of the non-rectangular die area is elliptical.

5. The semiconductor structure of claim 4, wherein the number of edges of the reticle area is 6.

6. The semiconductor structure of claim 1, further comprising at least one mark within the reticle area.

7. The semiconductor structure of claim 1, wherein the non-rectangular die area comprises planar CMOS or FinFETs.

8. The semiconductor structure of claim 1, wherein the non-rectangular die area is vertically electrically connected with a rectangular die area of another semiconductor structure using through substrate vias (TSVs).

9. A semiconductor wafer, comprising:
   a plurality of non-rectangular die areas; and
   a plurality of reticle areas, each surrounding the corresponding non-rectangular die area,
   the plurality of reticle areas are non-rectangular.

10. The semiconductor wafer of claim 9, wherein the shape of each non-rectangular die area has a circular-like shape.

11. The semiconductor wafer of claim 10, wherein the reticle area is hexagonal.

12. The semiconductor wafer of 9, wherein the shape of each non-rectangular die area is elliptical.

13. The semiconductor wafer of claim 12, wherein each reticle area is hexagonal.

14. The semiconductor wafer of claim 9, further comprising at least one mark between two adjacent reticle areas.

15. The semiconductor wafer of claim 9, wherein a minimal distance between an edge of the reticle area and an edge of the non-rectangular die area is in a range approximately 10 µm to 500 µm.

16. A semiconductor wafer, comprising:
   a non-rectangular die area; and
   a reticle area surrounding the non-rectangular die area,
   wherein a ratio of the reticle area to the non-rectangular die area is less than 4/π.

17. The semiconductor wafer of claim 16, wherein the number of edges of the reticle area is not equal to 4.

18. The semiconductor wafer of claim 16, wherein the reticle area is a hexagon.

19. The semiconductor wafer of claim 16, wherein the shape of the non-rectangular die area is circular.

20. The semiconductor wafer of claim 16, further comprising at least one mark between two adjacent reticle areas.

* * * * *